United States Patent [19]
Wu et al.

[11] Patent Number: 5,329,480
[45] Date of Patent: Jul. 12, 1994

[54] NONVOLATILE RANDOM ACCESS MEMORY

[75] Inventors: Jiin-Chuan Wu, Feng Shan, Taiwan; Henry L. Stadler, Berkeley; Romney R. Katti, Pasadena, both of Calif.

[73] Assignee: California Institute of Technology, Pasadena, Calif.

[21] Appl. No.: 993,012

[22] Filed: Dec. 18, 1992

Related U.S. Application Data

[63] Continuation-in-part of Ser. No. 614,148, Nov. 15, 1990, abandoned.

[51] Int. Cl.$^5$ ............................................. G11C 11/18
[52] U.S. Cl. ................................... 365/170; 365/171; 257/421
[58] Field of Search ........................... 365/170, 171, 9; 357/27

[56] References Cited

U.S. PATENT DOCUMENTS

| | | | |
|---|---|---|---|
| 3,037,199 | 5/1962 | Grant | 340/174 |
| 3,233,228 | 2/1966 | Kaspar | 340/174 |
| 3,521,255 | 7/1970 | Arndt | 340/174 |
| 3,973,182 | 8/1976 | Kataoka | 365/170 X |
| 4,021,767 | 5/1977 | Nonaka et al. | 357/27 X |
| 4,028,718 | 6/1977 | Migitaka et al. | 357/27 |
| 4,188,605 | 2/1980 | Stout | 357/27 X |
| 4,223,292 | 9/1980 | Morikawa et al. | 357/27 X |
| 4,803,658 | 2/1989 | Grimes | 365/87 |
| 5,089,991 | 2/1992 | Matthews | 365/170 X |

OTHER PUBLICATIONS

S. J. Hefferman, et al., "In-situ magnetizing experiments on small regular particles fabricated by electron beam lithography," J. Magnetism and Magnetic Materials, vol. 83, p. 223 (1990).

S. McVitie, et al., "Magnetic Structure Determination in Small Regularly Shaped Particles Using Transmission Electron Microscopy," IEEE Trans. on Magnetics, vol. 24, No. 2, pp. 178-180, Mar. 1988.

M. Isai, et al., "Influence of thickness on the Galvanomagnetic properties of thin InSb films for highly sensitive magnetoresistance elements," J. Appl. Phys. 59(8), pp. 2845-2848, Apr. 15, 1986.

*Primary Examiner*—Eugene R. LaRoche
*Assistant Examiner*—Do Hyun Yoo
*Attorney, Agent, or Firm*—Antonio M. Fernandez

[57] ABSTRACT

A nonvolatile magnetic random access memory can be achieved by an array of magnet-Hall effect (M-H) elements. The storage function is realized with a rectangular thin-film ferromagnetic material having an in-plane, uniaxial anisotropy and inplane bipolar remanent magnetization states. The thin-film magnetic element is magnetized by a local applied field, whose direction is used to form either a "0" or "1" state. The element remains in the "0" or "1" state until a switching field is applied to change its state. The stored information is detcted by a Hall-effect sensor which senses the fringing field from the magnetic storage element. The circuit design for addressing each cell includes transistor switches for providing a current of selected polarity to store a binary digit through a separate conductor overlying the magnetic element of the cell. To read out a stored binary digit, transistor switches are employed to provide a current through a row of Hall-effect sensors connected in series and enabling a differential voltage amplifier connected to all Hall-effect sensors of a column in series. To avoid read-out voltage errors due to shunt currents through resistive loads of the Hall-effect sensors of other cells in the same column, at least one transistor switch is provided between every pair of adjacent cells in every row which are not turned on except in the row of the selected cell.

6 Claims, 4 Drawing Sheets

NONVOLATILE RANDOM ACCESS MEMORY

ORIGIN OF THE INVENTION

The invention described herein was made in the performance of work under a NASA contract, and is subject to the provisions of Public Law 96-517 (35 USC 202) in which the Contractor has elected to retain title.

This application is a continuation-in-part of application Ser. No. 07/614,148, filed Nov. 15, 1990, now abandoned.

TECHNICAL FIELD

This invention relates to a nonvolatile random access memory (RAM) and more particularly to a RAM utilizing an array of unit cells, each cell realized with a rectangular thin-film magnetic material having an in-plane bipolar remanent magnetization state with a high squareness hysteresis loop, a Hall-effect sensor, and integrated circuitry for incorporating the cells into a matrix of conductors and switching transistors to provide read and write operations.

BACKGROUND ART

Ever increasing data processing requirements demand faster and denser random access memory to keep pace with improved CPU speed and throughput. Semiconductor memories such as dynamic RAM and static RAM have very fast access times but are also volatile. Electrically erasable/programmable read only memories (EPROMs) are nonvolatile but have very long write times and offer a conflict between refresh needs and radiation tolerance. A ferroelectric RAM (FRAM) offers short read and write access times, but the data retention (nonvolatility) and the longevity of the ferroelectric material (reliability) are in question. The magneto-resistive random access memory (MRAM) is nonvolatile and has no problem with longevity but has long read access times (on the order of microseconds). None of the existing technologies can satisfy all of the needed data storage requirements. An objective of this invention is to provide an integrated fast access ($<100$ nsec), nonvolatile, radiation hard, high density ($>10^6$ bit/cm$^2$) random access memory for high speed computing using magnetic material for storage and Hall-effect sensors for reading out data stored.

It is noted that the concept of using magnetic material for a nonvolatile RAM has been implemented before, e.g., in core memory, cross-tie memory and the recent magnetic random access memory (MRAM). The Hall effect has also been used since it was discovered in 1879 to detect small magnetic fields. What has not been conceived heretofore are memories which combine magnetic storage with Hall-effect sensing to form what is referred to herein as magnetic-Hall random access memory MHRAM. Recent improvements in InSb deposition processing and technology, and recent studies on very small and thin permalloy particles, currently make possible the implementation of the novel MHRAM concept for high density, fast access, nonvolatile, radiation hard, random access memory.

STATEMENT OF THE INVENTION

In accordance with the present invention, a nonvolatile magnetic random access memory comprises an array of planar memory cells, each having a Hall-effect sensor and a thin-film magnetic layer made of material having in-plane, uniaxial anisotropy and in-plane, bipolar remanent magnetization states. The memory cells are organized in rows and columns. All voltage sensing leads (sometimes referred to hereinafter as "conductors") connected to side edges of the Hall-effect sensors in the same column are connected in series to a separate differential voltage amplifier for each column. In one embodiment, read-out current leads (sometimes referred to hereinafter as "conductors") of the Hall-effect sensors on the same row are also connected in series, with a read-current control switch at each end. Separate write current leads (sometimes referred to hereinafter as conductors) are provided perpendicular to the magnetic layer of each cell, and address switching means provides for selecting cell write conductors and the polarity of current through the selected write conductors for storing a bit 1 or 0. The information stored in the thin-film magnetic material is read out of a selected cell by passing a sensing current through the series connected Hall-effect sensors in the row of the selected cell, which then produces a differential potential, the polarity of the differential potential depending upon the polarity of magnetization of the magnetic laser.

A problem with operation of this first embodiment is that the Hall-effect sensors are resistive loads so that when a current is conducted through the Hall-effect sensors of a row for reading out a selected cell in one column, shunt current can also flow through voltage sensing conductors of the selected Hall-effect sensor and of all other cells in the column. This shunt current introduces an error voltage that results from not only an IR voltage in the Hall-effect sensor of the selected cell, but also of other cells in the column of the selected cell, and to differential potentials produced on Hall-effect sensors of other cells in the column due to shunt current through them. These potentials are added or subtracted to the differential potential of the selected current, depending upon whether the bits stored in those other cells are a 1 or a 0. To eliminate that source of readout error, at least one current control transistor switch is provided between pairs of adjacent cells in each row to block any shunt current.

The novel features that are considered characteristic of this invention are set forth with particularity in the appended claims. The invention will best be understood from the following description when read in connection with the accompanying drawings.

BRIEF DESCRIPTION OF THE DRAWINGS

FIG. 1b illustrates a side view of FIG. 1a taken along a line b—b in FIG. 1a when the magnetic layer is magnetized in one state shown in FIG. 1a.

FIG. 3b is a cross section taken along a line b—b in FIG. 3a and FIG. 3c is a cross section taken along a line c—c in FIG. 3a.

DETAILED DESCRIPTION OF THE INVENTION

Figure 1C:
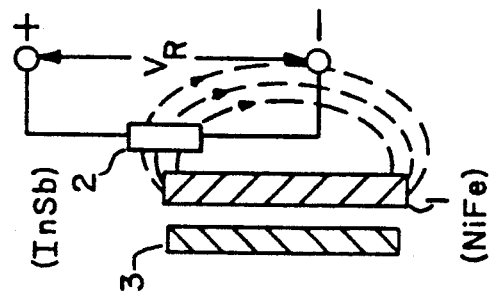
FIG. 1c illustrates the structure of FIG. 1b when the magnetic layer thereof is magnetized in an opposite state from that shown in FIG. 1b.
Figure 1B:
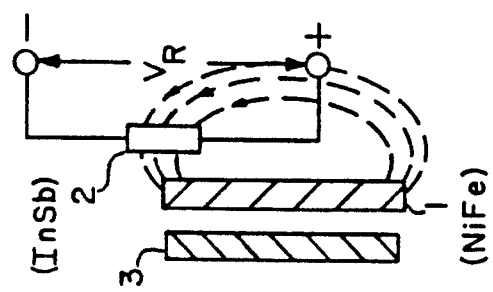
Figure 1A:
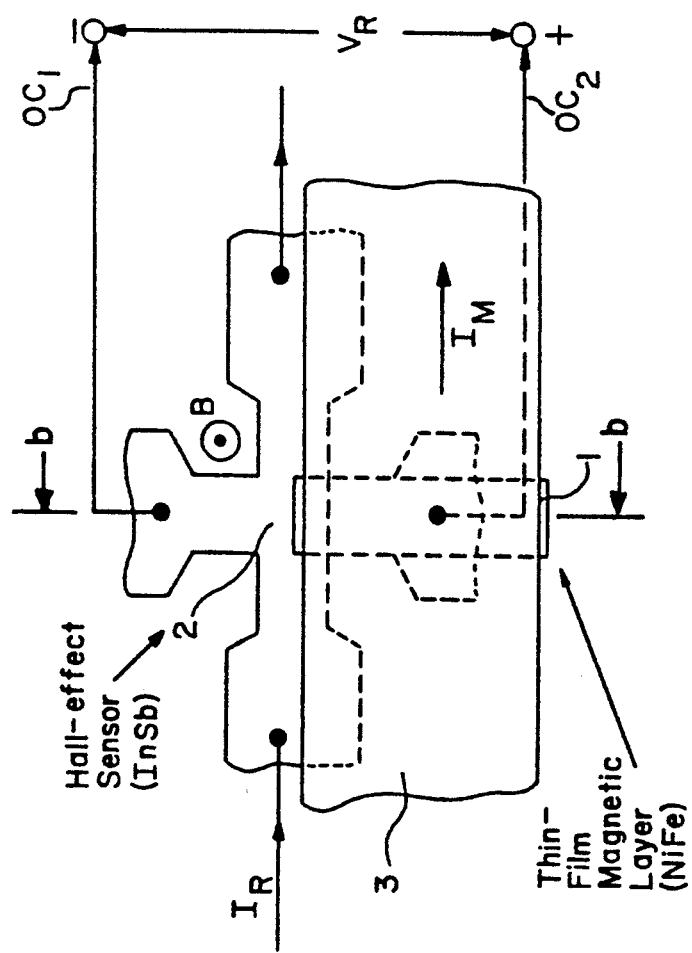
FIG. 1a illustrates the structure of a magnet-Hall (M-H) element employed in a unit memory cell of a 2×2 MHRAH memory shown in FIG. 3.

The structure of a magnet-Hall (M-H) element shown in FIG. 1a for a unit memory cell uses an in-plane, thin-film magnetic layer 1 and a Hall-effect sensor 2. Since the Hall-effect sensor only detects the vertical component of the magnetic field B, the center of the sensor is positioned at the edge of one narrow end of the magnetic layer 1, as shown in FIG. 1b and 1c where the fringing field through the sensor is a maximum. Increasing the in-plane aspect ratio of the thin film magnetic layer of each unit cell with a narrow end near the center of the Hall-effect sensor increases the squareness of the hysteresis loop, which in turn increases the fringing field of magnetic flux passing through the Hall-effect sensor from the proximal narrow end of the thin-film magnetic layer. Because the sensor is not located on the same plane as the magnetic layer as shown in FIG. 1b, the fringing field from the magnetic layer has a nonzero component passing through the Hall-effect sensor. When the state of magnetization of the magnetic layer is reversed by a current $I_M$ through a conductor 3 in an opposite direction, the sense of the magnetic field B also reverses, as shown in FIG. 1c.

As will be noted more fully hereinafter, it is intended to use CMOS integrated circuit technology with all components of an M-H element deposited on a chip. Consequently, it is to be understood that a layer of electrical insulating material is provided between the magnetic layer 1 and the Hall-effect sensor 2 on one side and the conductor 3 on the other side. That is accomplished by depositing an oxide layer (not shown) over the Hall-effect sensor 2 before depositing the magnetic layer 1 and again before depositing the conductor 3 of each M-H element, or preferably diffusing the conductor 3 in a substrate and then after growing an oxide layer, depositing the thin layer of magnetic material followed by another oxide layer and then the Hall-effect sensor, thus inverting the arrangement of FIG. 1a. In order to produce the Hall-effect sensor 2 in a p-type substrate, n-type impurities could be diffused in the necessary pattern, and then the layer 1 of magnetic material and the conductor 3 may be laid down with insulating oxide layers in between. In that case, the p-n junction between the n-type sensor and the p-type substrate would need to be reverse biased in order to electrically isolate the sensor.

Figure 2:
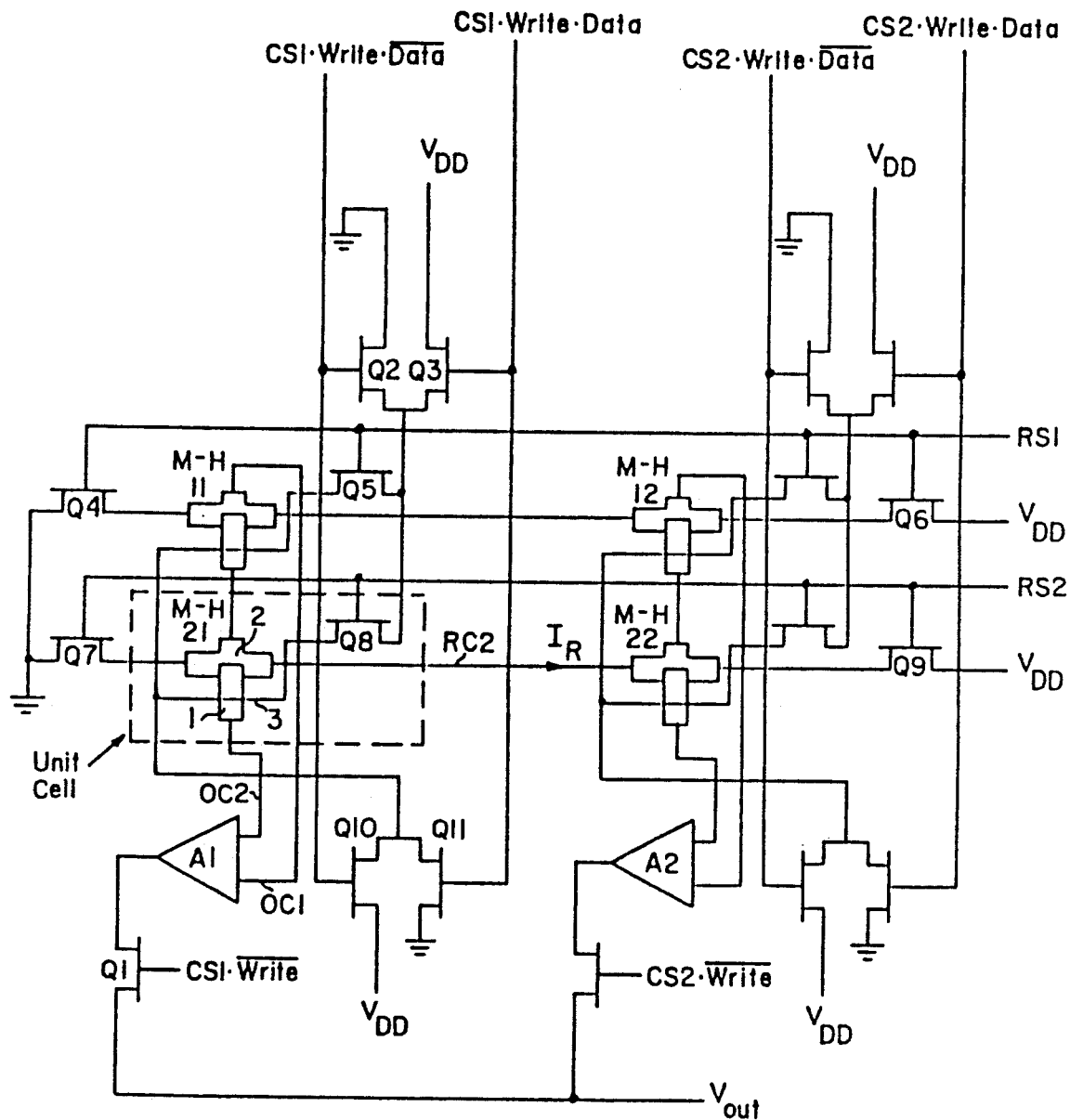
FIG. 2 is a circuit diagram of a 2×2 MHRAM memory having two rows and two columns of magnetic-Hall elements M-H 11 through M-H 22.

One organization for a 2×2 bit MHRAM is shown schematically in FIG. 2 using CMOS technology. The M-H elements are implemented with in-plane, thin-film Permalloy NiFe as shown in FIG. 1a. Consider the unit cell M-H 21 at the intersection of the second row and the first column. During reading, transistors Q7 and Q9 are turned on by an address signal RS2 which sends a sensing current through the second row conductor RC2 to produce a Hall voltage $V_R$ at every Hall-effect sensor in the second row. Each Hall voltage produced by a sensor in the first column is amplified by an amplifier A1. Note that the output voltage terminals of the Hall-effect sensors in each column are connected in series, but only one Hall-effect sensor (M-H 21) has a sensing current through it. Consequently, only that one Hall-effect sensor produces an output Hall voltage $V_R$ between output conductors OC1 and OC2 which can be calculated in volts by the equation $$V_R = \frac{10^{-5} R_H}{t} I_R B,$$

where
$R_H$ = Hall coefficient, cm$^3$/coulomb,
$t$ = thickness of Hall sensor, cm
$I_R$ = sense current, Amp,
$B$ = magnetic flux density, kilogauss.

The unit cell M-H 22 in the second column also conducts the sensing current $I_R$ in the second row conductor RC2 and therefore produces a Hall voltage. However, only transistor Q1 for the first column is turned on by a column select address signal CS1·$\overline{\text{Write}}$, so that only the Hall voltage output from the unit cell M-H 21 is amplified as the final output, $V_{out}$.

For an n-type material in the Hall-effect sensor, a Hall voltage $V_R$ is developed across conductors OC1 and OC2 with conductor OC1 being negative with respect to terminal OC2 when the sensing current $I_M$ is flowing through it to the right, and the magnetic field B is pointing out of the paper as shown in FIG. 1a. The polarity of the Hall voltage reverses when the direction of the magnetic field B is reversed, as shown in FIG. 1c.

The output sensitivity of the Hall-effect sensor using InSb semiconductor material is 0.5 mV/mA/Oe. A 10 mV output signal can be obtained at 0.4 mA and 50 Oe field. Unit cells implemented in this manner are incorporated by an integrated circuit into a matrix of read-/write cell-selecting transistors to form a nonvolatile random access memory. Note that the command signal $\overline{\text{Write}}$ could be substituted by a totally separate Read command signal.

A write operation will now be described. Assume that the same unit cell M-H 21 at the intersection of the second row and the first column is selected for writing. If the bit value to be written is a "1," that is to say "data" is true, then transistors Q3, Q8 and Q11 are turned on, and if the bit value to be written is a "0," then transistors Q2, Q8 and Q10 are turned on. Which pair of transistors is turned on (Q2, Q10 or Q3, Q11) depends upon whether the data bit is 0 or 1. The bit value then determines the sense of the write current $I_M$ through the conductor 3 over the thin-film magnetic element and therefore the sense of the in-plane magnetization. Transistor Q8 is thus turned on in either case by the row select signal RS2. Transistors Q7 and Q9 are also turned on by the row select signal RS2 in the same way as for a $\overline{\text{Write}}$ operation, but the transistor Q1 is not turned on because although the column select signal CS1 is true, the $\overline{\text{Write}}$ command signal is not true.

A magnet-Hall effect random access memory (MHRAM) thus stores information magnetically in small thin-film elements of magnetic material allowing unlimited data retention time, unlimited number of rewrite cycles, and inherent radiation hardness, i.e., immunity to single-event upset (SEU) due to impact by ionized particles, making the MHRAM suitable for ground based as well as space flight applications. It is highly immune to the areal property fluctuation in the thin-film magnetic element, so that high yield can be achieved in large scale IC fabrication.

High storage density is achieved since the unit cell size is less than 100$\lambda^2$, where $\lambda$ is the minimum lithographic feature size, so that a density greater than 10$^6$ bit/cm² is achieved using 1 μm lithography. A unit cell consists only of one transistor and one magnet-Hall effect element, such as transistor Q8 and M-H 21 for the first column, second row of the 2×2 array of unit cells in FIG. 2. By comparison, a DRAM unit cell has one transistor and one capacitor, and an SRAM unit cell has six transistors.

Figure 3A:
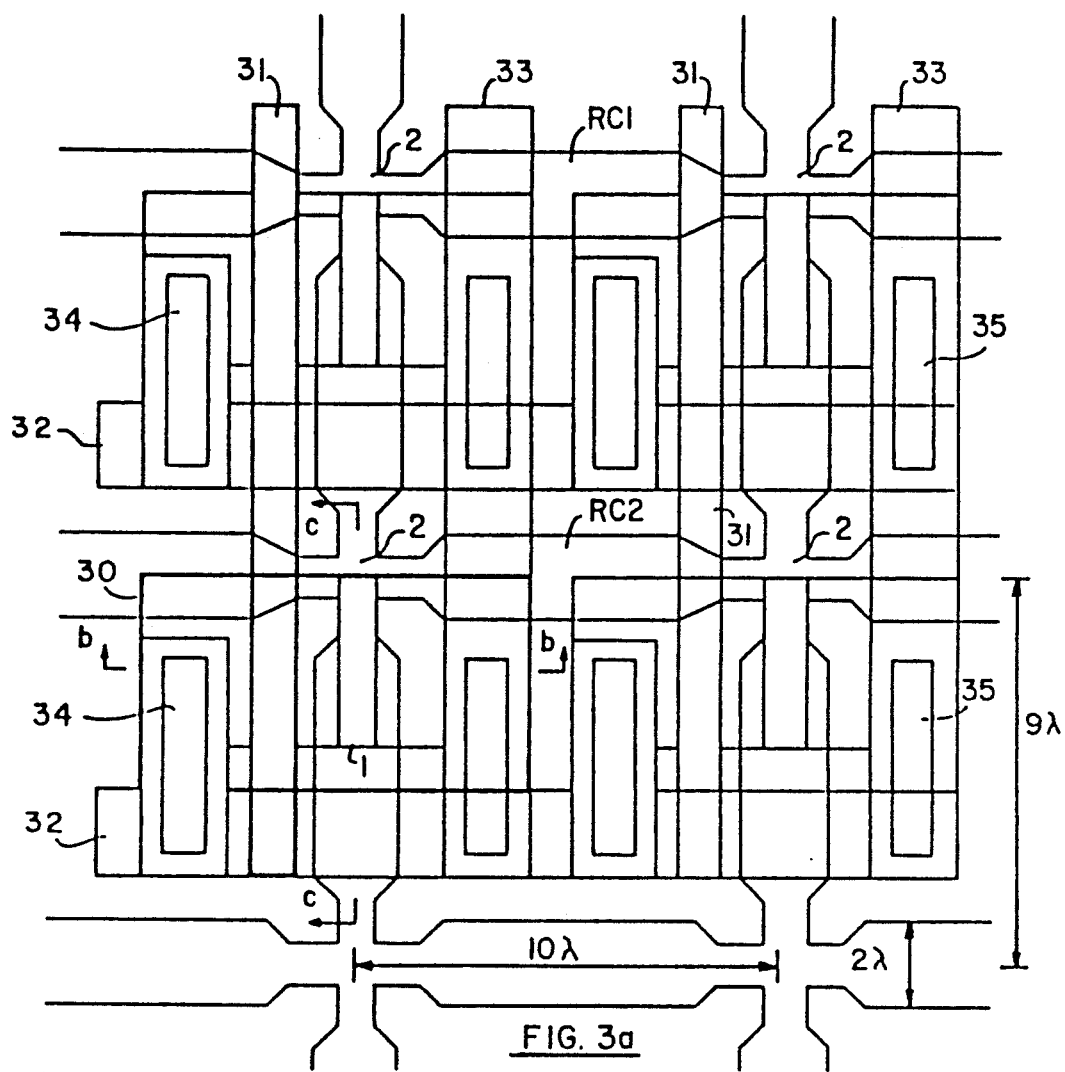
FIG. 3a illustrates a layout of the M-H elements for the 2×2 MHRAM memory shown in FIG. 2.

An example of the layout of a 2×2 bit MHRAM memory array of unit cells is shown in FIG. 3a without the addressing transistors and conductors, i.e., with only one transistor per unit cell used for selecting the polarity of the current $I_M$ shown in FIG. 1a to store a bit "0" or "1." That one transistor of a unit cell is formed at the intersection of a rectangular diffusion region 30 outlined by a heavy line for one unit cell, and a polysilicon region 31 similarly outlined by a heavy line. The diffusion region 30 fulfills the function of the conductor 3 in the M-H element of FIGS. 1a, b and c for one unit cell and is therefore preferably made as wide as the thin-film magnetic element 1 is long so that the current flowing through the transistor (with a polarity selected by transistors not shown in this array of unit cells) provides a uniform current across the length of the magnetic element 1, and therefore a uniform magnetic field that sets the magnetic element in the desired state. The magnetic element is shaded for that one M-H element of a single unit cell. In this layout, the size of the unit memory cell is $9\lambda \times 10\lambda$, or $90\lambda^2$, where $\lambda$ is the minimum line width.

It should be noted that to make the MHRAM memory, only two more masking steps are required besides the standard IC processing steps for the CMOS circuitry (assuming a single-poly double-metal CMOS process of fabrication), one for deposition of InSb semiconductor material in the desired pattern of Hall-effect sensors and conductors and one for deposition of the desired pattern of in-plane magnetic elements. It is therefore possible to fabricate an array of unit cells in an IC chip together with the necessary addressing circuitry.

Figure 3B:
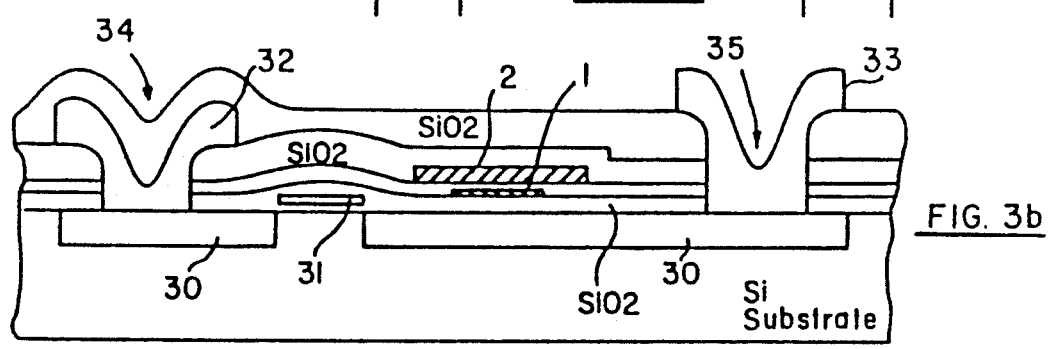
Figure 3C:
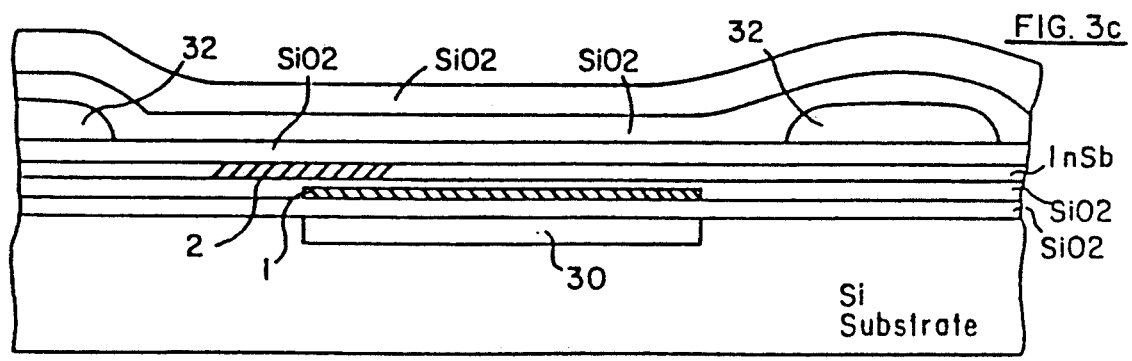

FIGS. 3b and 3c show cross sections taken along lines b—b and c—c, respectively, for the M-H element of a single unit cell. Starting with a silicon substrate, the region 30 is created by diffusion and then a layer of $SiO_2$ is grown. Next a polysilicon strip 31 is grown (FIGS. 3a and 3b) followed by another $SiO_2$ layer. Then the layer of magnetic material is grown by molecular beam epitaxy. After growing another $SiO_2$ layer, the pattern of semiconductor material for the sensor is deposited. Note that the sensor pattern includes horizontal and vertical interconnecting conductors, and that only the square portion where the conductors intersect will function as the Hall sensor. That portion is shaded in FIGS. 3b and 3c. After growing another layer of $SiO_2$ a horizontal metal conductor 32 is deposited, and after growing yet another layer of $SiO_2$ a vertical metal conductor 33 is deposited. A final layer of $SiO_2$ is then grown over the entire IC chip. But first the $SiO_2$ layers are opened in a rectangular region 34 to connect to one end of the diffusion region 30. Thus, rectangular region 35 is opened to connect the vertical conductor 33 to the other end of the diffusion regions 30. As noted hereinbefore, this integrated circuit layout has not been optimized, and the sequence of steps to be employed have not been finalized. The layaout of FIG. 3a is presented as a suggested approach to an optimized and finalized layout with emphasis given to consideration of how to fabricate the M-H elements of the unit cells rather than the CMOS circuit shown in the schematic diagram of FIG. 2.

The MHRAM implemented with CMOS integrated circuit technology is expected to have short access times (<100 nsec). Write access time is expected to be short because on-chip transistors are used to gate current quickly, and magnetization reversal can occur in a few nanoseconds. The switching field for the magnetic storage elements using Permalloy NiFe (78.5% nickel, 21.5% iron) is about 50 Oe, so that sufficient stability is obtained while minimizing switching currents to reduce the power dissipation. Read access time is expected to be short because the Hall-effect sensor (InSb) produces a large signal voltage in response to the fringing magnetic field from the thin-film magnetic element.

Although the Permalloy NiFe is preferred, other magnetic materials may be employed, such as $Fe_2O_3$ or $Fe_3O_4$, both of which may be deposited like Permalloy, e.g., by sputtering. Another possibility is cobalt polycrystal which may be vapor deposited. And although silicon is used as the substrate in order to more economically produce the CMOS integrated circuit, a GaAs substrate may be used, in which case the Hall-effect sensors and interconnecting conductors may be formed in the substrate by starting with a p-type substrate and diffusing an N-type pattern for the sensors and interconnecting conductors as suggested hereinbefore. Other substrate materials include InSb and InAs which may be preferable to GaAs. In all of these compound substrate materials, where the Hall-effect sensors and interconnecting conductors are formed by diffusion of impurities, the p-n junction needs to be reverse biased in order to isolate the sensors and interconnecting conductors. Still other variations may occur to those skilled in the art with attention to the electron mobility and Hall coefficient in order to achieve acceptable read access times for the particular application of the MHRAM fabricated.

Full Memory Organization and Operation

The organization of a memory plane using in-plane M-H elements has been shown in FIG. 3a for illustrative purposes; it has not been optimized for density, power or speed considerations. In implementing a full memory having N-bits per word, N memory planes would be stacked and driven together for row and column select (i.e., for selection of an N-bit memory location) while each plane is controlled individually for storing individual bits in the separate memories just as in a conventional RAM scheme. Each M-H element in every plane is implemented as shown in FIGS. 1a-c, and every plane is organized as shown in FIG. 2. The same cell is selected in the same way for every plane, only the data bit stored in the selected unit cell of each plane may differ from the other planes.

The number of sense amplifiers in each plane can be reduced from one for each column to just one for the entire plane if each selection transistor corresponding to the transistor Q1 in FIG. 2 is placed at an input terminal of the one sense amplifier, thus time-sharing with each column the single sense amplifier for the plane. This is possible because only one column may be selected to read out at any one time from each memory plane.

The write operation for a full memory is straightforward. The value of the datum determines the sense of the current $I_M$ through the conductor 3 over the magnetic element 1 as shown in FIG. 1a and therefore the sense of the in-plane magnetization. Note that there is no half-select problem, i.e., the switching current $I_M$ is applied only to the magnetic element of the selected unit cell of each plane, the rest of the magnetic elements in the entire memory are not subjected to any switching current. Consequently, the switching current can be set higher than the maximum required switching threshold of the magnetic element and the writing process is immune to fluctuations in the threshold value. With this memory organization, large operating margins and hence high chip yields can be achieved.

A full memory organized in accordance with this invention can replace ROMs, EPROMs, EEPROMs, and SRAMs, because it offers better performance in every aspect with higher density, higher speed, lower cost, lower power dissipation and true nonvolatility.

It has been discovered that the nonvolatile random access memory described with reference to FIG. 2 may have a current shunting problem when a large number of memory cells are arrayed in a matrix of rows and columns. Although the 2×2 matrix shown in FIG. 2 may not be large enough to manifest the problem, depending upon resistance parameters, it can be used to point out the nature of the current shunting problem that would manifest itself in a larger array, such as a 32×32 matrix. Therefore, the memory organization for the read-out in the memory array in FIG. 2 will be reviewed in order to point out the problem.

In order to share the sense amplifiers A1 and A2 in FIG. 2, all the voltage leads of the Hall sensors in the same column are connected in series, e.g., the voltage leads of the Hall sensors in the first column of cells M-H 11 and M-H 21 are connected in series between the input terminals of the differential sense amplifier A1, In that manner, only one sense amplifier is needed for each column. The horizontal read current conductors of the Hall sensors of cells on the same rows are also connected in series by current leads RC1 and RC2. Sensing current for each row of cells is controlled by two transistors, one on each end of the row. To read the cell M-H 21, the signals RS2 (row select 2) and CS1 (column select 1) become high, and the control signal Write becomes low ($\overline{\text{Write}}$ becomes high), so that transistors Q7, Q9 and Q1 are turned on. With transistors Q7 and Q9 turned on, sensing current flows through the current lead RC2 and the Hall sensors in cells M-H 21 and M-H 22 so that each of the sense amplifiers A1 and A2 produce a signal at its output terminal. However, since only transistor Q1 is turned on, only the signal from sense amplifier A1 is passed to the output, $V_{out}$.

The problem is that the Hall-effect sensors are resistive loads. When transistors Q7 and Q9 are turned on to let the current $I_R$ flow through Hall-effect sensors of cells M-H 21 and M-H 22, the current can also flow from that current conductor of cell M-H 21 through its upper voltage lead to the Hall-effect sensor of cell M-H 11, then through the current lead RC1 to the Hall-effect sensor of the cell M-H 12, and from there through its lower voltage lead to the Hall-effect sensor of cell M-H 22. This shunt current will introduce IR voltage drops in the Hall-effect sensors of the cells M-H 21 and M-H 11. The IR voltage thus produced in the Hall-effect sensor of the cell M-H 21 will be added algebraically to the differential potential developed in the Hall-effect sensor of the cell M-H 21 and thus be presented to the input terminals of the sense amplifier A1 as an error in the output voltage from amplifier A1.

In addition, current which passes from the lower voltage sensing lead of the Hall-effect sensor of the cell M-H 11 to the sensing current lead RC1 will produce a differential potential between the side edges of the Hall-effect sensor in the cell M-H 11. That differential potential may be less than is normally produced by read-out sensing current through transistors Q4 and Q6, but it will have a polarity which depends upon whether the bit stored in the cell M-H 11 is a 1 or a 0, and it will be added algebraically to the differential potential of the cell M-H 21 that has been selected to be read out.

The total effect of the IR and differential voltage errors from all cells of the column selected by the column select signal CS1 applied to transistor Q1 will depend upon the number of cells in the column and the relative position of the selected cell in the column. It would therefore be impractical to attempt to compensate for such shunt current errors. The shunt error voltages produced in other cells in the column of the cell M-H 12 are also added to the differential voltage presented to the sense amplifier A2, but that amplifier is isolated from the voltage output terminal, $V_{out}$, since the column select signal CS2 is not high in this example; only the column select signal CS1 is high to turn on the transistor Q1 in order to read out a cell in the first column. Thus only the error voltage introduced by shunt current through the Hall-effect sensor of the cell M-H 11 is a problem.

The solution to this problem is a read circuit design with at least one transistor switch between every adjacent pair of cells in each row. A first example shown in FIG. 4a uses two transistor switches, one on each side of the Hall-effect sensor for the cell. For example, cell M-H 21 is isolated by transistors Q7a and Q7b. To read information from the cell M-H 21, read-out control signals CS1 and RS2 become high and Write becomes low ($\overline{\text{Write}}$ becomes high). Current flows from $V_{DD}$ through transistors Q12, Q7b and Q7a, and cell M-H 21 to circuit ground. Transistor switches Q4a and Q4b prevent any shunt current from flowing through cell M-H 11. Similar transistor switches on each side of every Hall-effect sensor of cells in the same column as M-H 11 and M-H 21 prevent any shunt currents because only the transistor switches Q7a and Q7b are turned on by the row select signal RS2 while the column select signal CS1 applied to transistor switch Q12 allows $V_{DD}$ to be applied to only the current sensing leads of the cell M-H 21. All other cells of the array have their current sensing leads isolated by the transistor switches on each side of their Hall-effect sensors.

Figure 4A:
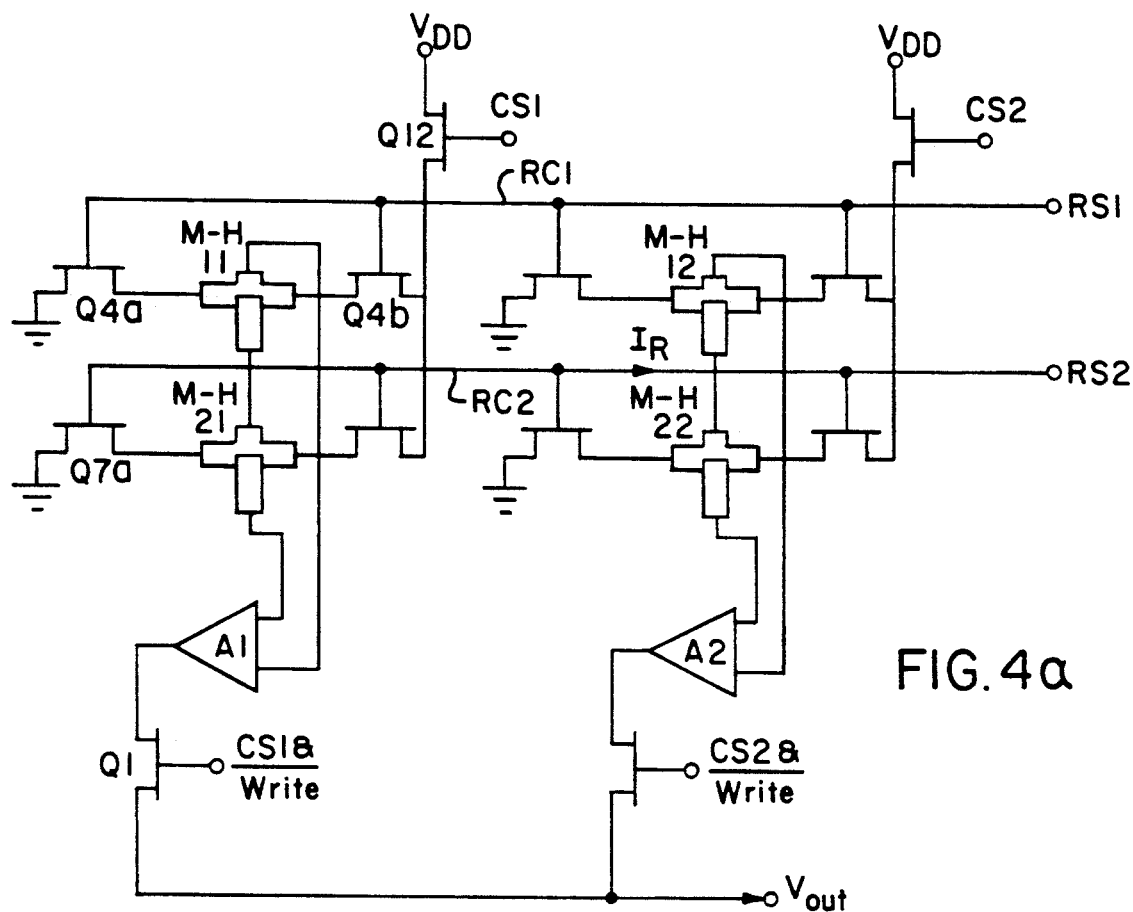
FIGS. 4a and 4b illustrate schematically two alternative designs for circuitry to read out of selected cells of the memory array that avoid effects of shunt currents in the design of FIG. 2.
Figure 4B:
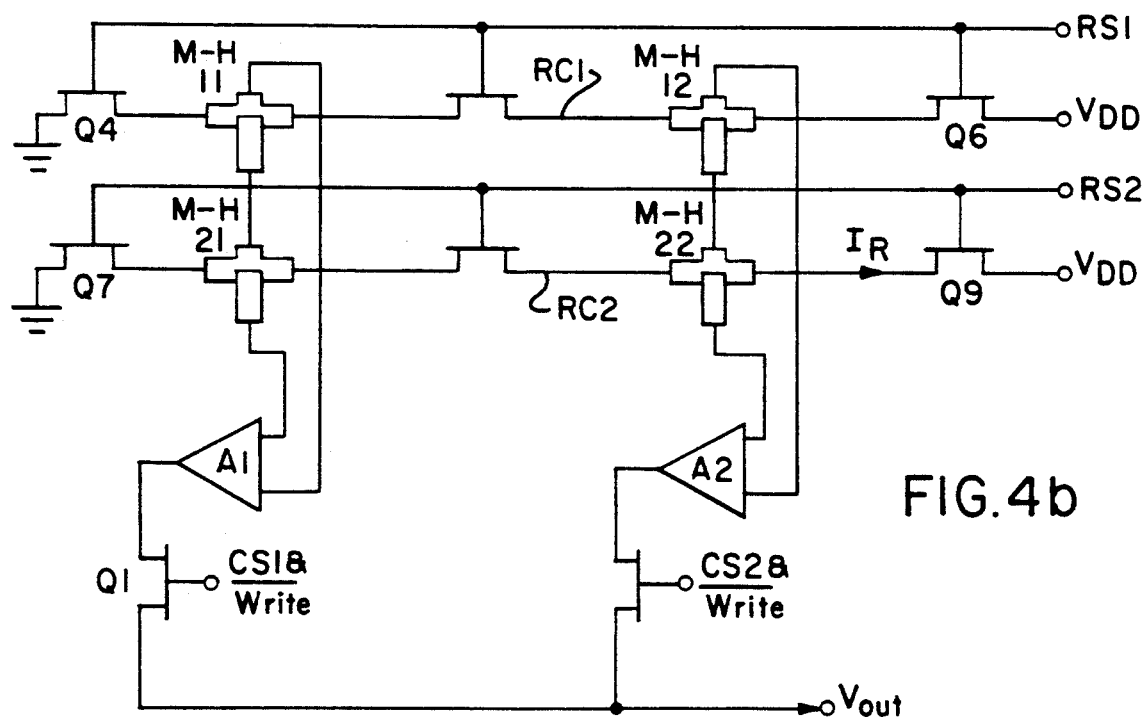

In the second example shown in FIG. 4b, only one transistor is added between every pair of adjacent cells to the arrangement of FIG. 2 which uses for each row of cells one transistor switch at each end of cells in the same row. The advantage of this design is that each pair of adjacent cells in a row share one transistor switch to block shunt current instead of each cell having two transistor switches as shown in FIG. 4a. In both cases, when the row-select signal RS2 is high, transistors Q7, Q12 and Q9 are on for read-out current on the conductor RC2, but since the row-select signal RS1 is low, corresponding transistors in the first row are off so there is no shunt current through cell M-H 11.

It should be noted that in each design of FIG. 2, FIG. 4b and FIG. 4b there could, theoretically, be some shunt current from the second row conductor RC2 through the voltage leads of the Hall-effect sensor of cell M-H 21 to the differential amplifier A1 that would then introduce an IR voltage error, but in fact there is not any shunt current through that path because, as a differential voltage amplifier, the amplifier A1 is designed to have a very high input impedance. That is inherent in the design of every voltage amplifier, and in particular a differential voltage amplifier, as is employed here.

The adaptation of either of these designs to a memory array larger than 2×2 without limit is straightforward. In general, the number of transistors needed per cell is either 2 or (N+1)/N, where N is the number of cells in a row. In the special case of a minimum number N=2 used for illustration in the examples, the number of transistors needed per cell in the example of FIG. 4b is (N+1)/N=1.5 instead of 2 for the example shown in FIG. 4a, but as the number N is increased to 16, 32 or 64, for example, the number of transistors needed per cell approaches 1. In both cases (FIG. 4a and FIG. 4b), the circuit design for writing a bit into a selected cell remains the same as in FIG. 2 for an array of any size.

Although particular embodiments of the invention have been described and illustrated herein, it is recognized that modifications and variations may readily occur to those skilled in the art. Consequently, it is intended that the claims be interpreted to cover such modifications and equivalents.

We claim:

1. An array of nonvolatile magnetic random access memory cells arranged in rows and columns, each cell having
    a Hall-effect sensor of semiconductor material and a magnetic storage element, said Hall-effect sensor comprising a rectangular shape of said semiconductor material and said magnetic storage element comprising a thin-film layer of magnetic material having a discrete width and a length greater than said width, said magnetic material having an in-plane uniaxial anisotropy and in-plane bipolar remanent magnetization states, both of said in-plane characteristics of said magnetic material being in said layer of magnetic material along said length, said magnetic storage element being positioned with one end having said discrete width near the center of said Hall-effect sensor,
    separate switching means for each row of cells for selectively conducting a sensing current through said Hall-effect sensor of each cell in a row from one end to an opposite end of said rectangular shape in a direction perpendicular to said length of said thin-film layer of magnetic material, thereby producing a differential in electrical potentials on sides of said rectangular shape that are parallel to said sensing current conducted through said Hall-effect sensor, and
    separate means for each column of cells for amplifying said differential in electrical potentials of each cell in a row selected by said separate switching means, whereby a signal is produced the polarity of which corresponds to said bipolar remanent magnetization state of said layer of magnetic material along said length thereof,
    each cell further having a conductor perpendicular to and overlaying said length of said layer of magnetic material, and
    switching means for momentarily applying a current through said conductor with a selected polarity for storing a binary digit 1 or 0 in said layer of magnetic material, thereby setting said bipolar remanent magnetization state of said layer of magnetic material to a selected state representative of a binary digit of 1 or 0.

2. A nonvolatile random access memory comprising a plurality of nonvolatile magnetic random access memory cells arranged in a matrix of rows and columns, each cell having a Hall-effect sensor of semiconductor material and a magnetic storage element, said Hall-effect sensor comprising a rectangular shape of said semiconductor material having a length oriented along one of said rows and said magnetic storage element comprising a thin-film layer of magnetic material having a discrete width and a length greater than said width oriented along one of said columns, said magnetic material having an in-plane uniaxial anisotropy and in-plane bipolar remanent magnetization states oriented along one of said columns, said magnetic storage element being positioned with one end having said discrete width near the center of said Hall-effect sensor,
    each cell having a conductor perpendicular to and overlaying said length of said layer of magnetic material, and the memory further comprising
    switching means for momentarily applying a current through said conductor with a selected polarity for storing a binary digit 1 or 0 in said layer of magnetic material, thereby setting said bipolar remanent magnetization state of said layer of magnetic material to a selected state representative of a binary digit of 1 or 0,
    conductors for connecting in series said Hall-effect sensors of cells in each row,
    switching means for selectively conducting a sensing current through said Hall-effect sensor of each cell of one row at a time from one end to an opposite end thereof, thereby producing a differential in electrical potentials on sides of each Hall-effect sensor of polarities that depend upon polarities of magnetization states of said magnetic material,
    conductors for connecting in a series circuit said Hall-effect sensors of cells in each column, thereby producing across ends of said series circuit a potential difference at sides of a Hall-effect sensor in said one row selected by said switching means to conduct sensing current,
    means comprising a plurality of differential amplifiers for amplifying said differential in electrical potentials produced across each series circuit of each column of cells, thereby sharing a single differential amplifier with all cells of a single column, and
    separate switching means for each column of cells for coupling a selected one of said plurality of differential amplifiers to a single output terminal for said matrix, whereby a single differential amplifier out of said plurality of differential amplifiers serves all unit cells of a single column for providing an output data bit in each column of said matrix while said switching means for selectively conducting a sensing current is conducting sensing current in only one memory cell of each column.

3. A nonvolatile random access memory as defined in claim 2 wherein said switching means for selectively conducting a sensing current through said Hall-effect sensor of each cell of one row at a time comprises a row-select transistor switch at each end of each row of said series connected Hall-effect sensors for directing sensing current of predetermined polarity through each cell in a selected row of said matrix in response to a row select control signal.

4. A nonvolatile random access memory as defined in claim 3 wherein said switching means for selectively conducting a sensing current through said Hall-effect sensor of each cell of one row at a time includes a separate transistor switch between said Hall-effect sensors of each pair of adjacent cells of each row of said series connected sensors, whereby said series connection in each row is made through said separate transistor switches, and said separate transistor switches are normally nonconducting and are selected to be conducting together with said row-select transistor switch at each end of each row of said series connected Hall-effect sensors.

5. A nonvolatile random access memory comprising a plurality of nonvolatile magnetic random access memory cells arranged in a matrix of rows and columns, each cell having a Hall-effect sensor of semiconductor material and a magnetic storage element, said Hall-effect sensor comprising a rectangular shape of said semiconductor material having a length oriented along one of said rows and said magnetic storage element comprising a thin-film layer of magnetic material having a discrete width and a length greater than said width oriented along one of said columns, said magnetic material having an in-plane uniaxial anisotropy and in-plane bipolar remanent magnetization states oriented along one of said columns, said magnetic storage element being positioned with one end having said discrete width near the center of said Hall-effect sensor, each cell having a conductor perpendicular to and overlaying said length of said layer of magnetic material, and the memory further compressing switching means for momentarily applying a current through said conductor with a selected polarity for storing a binary digit 1 or 0 in said layer of magnetic material, thereby setting said bipolar remanent magnetization state of said layer of magnetic material to a selected state representative of a binary digit of 1 or 0, switching means for selectively conducting a sensing current through said Hall-effect sensor of one selected cell at a time in one row, thereby producing a differential in electrical potentials on sides of each Hall-effect sensor of a polarity that depends upon the polarity of magnetization states of said magnetic material in said selected cell, conductors for connecting in a series circuit said Hall-effect sensors of cells in each column, thereby producing across ends of said series circuit a potential difference at sides of a Hall-effect sensor in said one row selected by said switching means to conduct sensing current, means comprising a plurality of differential amplifiers for amplifying said differential in electrical potentials produced across each series circuit of each column of cells, thereby sharing a single column differential amplifier with all cells of a single column, and separate switching means for each column of cells for coupling a selected column differential amplifier to a single output terminal for said matrix, whereby a single column differential amplifier selected out of said plurality of differential amplifiers serves all unit cells of a single column for providing an output data bit in each column of said matrix while said switching means for selectively conducting a sensing current is conducting sensing current in only one memory cell of each column.

6. A nonvolatile random access memory as defined in claim 5, wherein said switching means for selectively conducting a sensing current through said Hall-effect sensor of one selected cell at a time in one row, thereby producing a differential in electrical potentials on sides of each Hall-effect sensor of a polarity that depends upon the polarity of magnetization states of said magnetic material in said selected cell, comprises two switching transistors one at each end of each Hall-effect sensor for each cell, said two switching transistors being controlled by a read-out control signal together with control of said separate switching means for each column for selection of said selected column differential amplifier.

* * * * *